(12) United States Patent
Chen

(10) Patent No.: US 12,284,779 B2
(45) Date of Patent: Apr. 22, 2025

(54) SERVER AND HOST CHASSIS THEREOF

(71) Applicant: Wistron Corporation, New Taipei (TW)

(72) Inventor: Jun-Yu Chen, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 164 days.

(21) Appl. No.: 18/156,071

(22) Filed: Jan. 18, 2023

(65) Prior Publication Data
US 2024/0098928 A1    Mar. 21, 2024

(30) Foreign Application Priority Data

Sep. 20, 2022    (TW) .................................. 111135616

(51) Int. Cl.
*H05K 7/14*    (2006.01)
(52) U.S. Cl.
CPC .................................. *H05K 7/1489* (2013.01)
(58) Field of Classification Search
None
See application file for complete search history.

(56) References Cited

U.S. PATENT DOCUMENTS

| | | | | |
|---|---|---|---|---|
| 2013/0176690 A1* | 7/2013 | Sun | .................. | H05K 5/023 361/747 |
| 2013/0255987 A1* | 10/2013 | Hu | .................. | H05K 7/20172 248/674 |
| 2022/0243935 A1* | 8/2022 | Chen | .................. | H05K 7/20736 |
| 2023/0128507 A1* | 4/2023 | Clark | .................. | H05K 7/20181 |

FOREIGN PATENT DOCUMENTS

CN        216486254 U        5/2022

OTHER PUBLICATIONS

Examination report dated Apr. 17, 2023, listed in related Taiwan patent application No. 111135616.

* cited by examiner

*Primary Examiner* — James Wu
*Assistant Examiner* — Christopher L Augustin
(74) *Attorney, Agent, or Firm* — McClure, Qualey & Rodack, LLP

(57) ABSTRACT

A server includes a housing, a fixing assembly, a dustproof device, a filler, a circuit board, and a transmission cable. The housing has an assembling opening. The fixing assembly is connected to the housing and has an accommodating portion and a first fixing portion. The dustproof device has a second fixing portion and a filtering portion. The second fixing portion is detachably connected to the first fixing portion. The filtering portion is in communication with the assembling opening. The filler is located in the accommodating portion. The circuit board is located in the housing. The transmission cable is located in the filler.

20 Claims, 9 Drawing Sheets

SERVER AND HOST CHASSIS THEREOF

CROSS-REFERENCE TO RELATED APPLICATION

This non-provisional application claims priority under 35 U.S.C. § 119(a) to Patent Application No. 111135616 filed in Taiwan, R.O.C. on Sep. 20, 2022, the entire contents of which are hereby incorporated by reference.

BACKGROUND

Technical Field

The instant disclosure relates to a server and a host chassis thereof, particularly to a server having a dustproof device and a host chassis thereof.

Related Art

Owing to the increase of the efficiency of electronic devices, during the operation of the electronic devices, a great amount of heats are generated. As a result, an electronic device known to the inventor is configured to guide the air into the interior of the electronic device for performing heat dissipation on the circuit board supported in the electronic device. However, the electronic device may be placed in outdoor environments or environments with poorer air qualities. Consequently, pollution matters (such as dusts or particulate matters) in the air will enter the electronic device along with the air. Moreover, the circuit board in the electronic device is usually connected to an external device through a transmission cable for retrieving electricity or performing data transmission. Furthermore, to allow the transmission cable to be connected to the external device, an opening (or a through hole) is provided on the chassis of the electronic device, so that the transmission cable protrudes out of the chassis through the opening. However, the pollution matters tend to enter the chassis of the electronic device easily through the opening, and thus may cause the damage of the electronic device.

SUMMARY

In view of this, the instant disclosure provides a server. In some embodiments, the server comprises a housing, a fixing assembly, a dustproof device, a filler, a circuit board, and a transmission cable. The housing has an assembling opening. The fixing assembly is connected to the housing and has an accommodating portion and a first fixing portion. The dustproof device has a second fixing portion and a filtering portion. The second fixing portion is detachably connected to the first fixing portion. The filtering portion is in communication with the assembling opening. The filler is located in the accommodating portion. The circuit board is located in the housing. The transmission cable is located in the filler.

In some embodiments, a host chassis is provided. The host chassis comprises a housing, a fixing assembly, a filler, and a dustproof device. The housing has an assembling opening. The fixing assembly is connected to the housing and has an accommodating portion and a first fixing portion. The filler is located in the accommodating portion. The dustproof device has a second fixing portion and a filtering portion. The second fixing portion is detachably connected to the first fixing portion. The filtering portion is in communication with the assembling opening.

In some embodiments, the second fixing portion comprises a positioning latch, an elastic arm, and an operating portion. The elastic arm is connected to the positioning latch and the operating portion, the positioning latch has a first position and a second position, and the positioning latch is normally at the first position. When the operation portion is actuated, the elastic arm allows the positioning latch to be selectively at the first position or the second position. When the positioning latch is at the first position, the positioning latch is fixed with the first fixing portion.

In some embodiments, the dustproof device further comprises a shell. The shell has a top plate and a side plate, the side plate has an avoidance opening and a through hole, and the second fixing portion is connected to the top plate and the side plate. When the positioning latch is at the first position, the positioning latch protrudes out of the through hole, and the transmission cable is located in the avoidance opening and the assembling opening and protrudes out of the filler.

In some embodiments, the elastic arm comprises a fixed sidearm, a movable sidearm, and a locked point, and the locked point is pivotally connected to the top plate. When the operation portion is actuated, the movable sidearm drives the positioning latch to be selectively at the second position.

In some embodiments, one end of the positioning latch has a guiding surface for guiding the positioning latch into the first fixing portion.

In some embodiments, the first fixing portion has a first groove and a second groove, the accommodating portion is between the first groove and the second groove, and the first groove and the second groove are substantially aligned with a plumb line.

In some embodiments, the fixing assembly comprises an opening portion and a cover plate, the opening portion is in communication with the accommodating portion, and the cover plate is pivotally connected to the opening portion. When the cover plate is actuated, the cover plate is selectively at the opening portion.

In some embodiments, the opening portion has a positioning post, and the cover plate has a positioning hole. When the cover plate is at the opening portion, the positioning post is located in the positioning hole.

In some embodiments, the filler has a slit, the slit has a first slit and a second slit, and the first slit is intersected with or parallel to the second slit.

Embodiments are provided for facilitating the descriptions of the instant disclosure. However, the embodiments are provided as examples for illustrative purpose, but not a limitation to the instant disclosure. Some elements in the drawings are omitted for clearly showing the technical features of the instant disclosure. In all the figures, the same reference numbers refer to identical or similar elements.

BRIEF DESCRIPTION OF THE DRAWINGS

The disclosure will become more fully understood from the detailed description given herein below for illustration only, and thus not limitative of the disclosure, wherein.

DETAILED DESCRIPTION

For the sake of clarity, many practical details will be described in the following description, but this is not intended to limit the scope of the instant disclosure.

Figure 1:
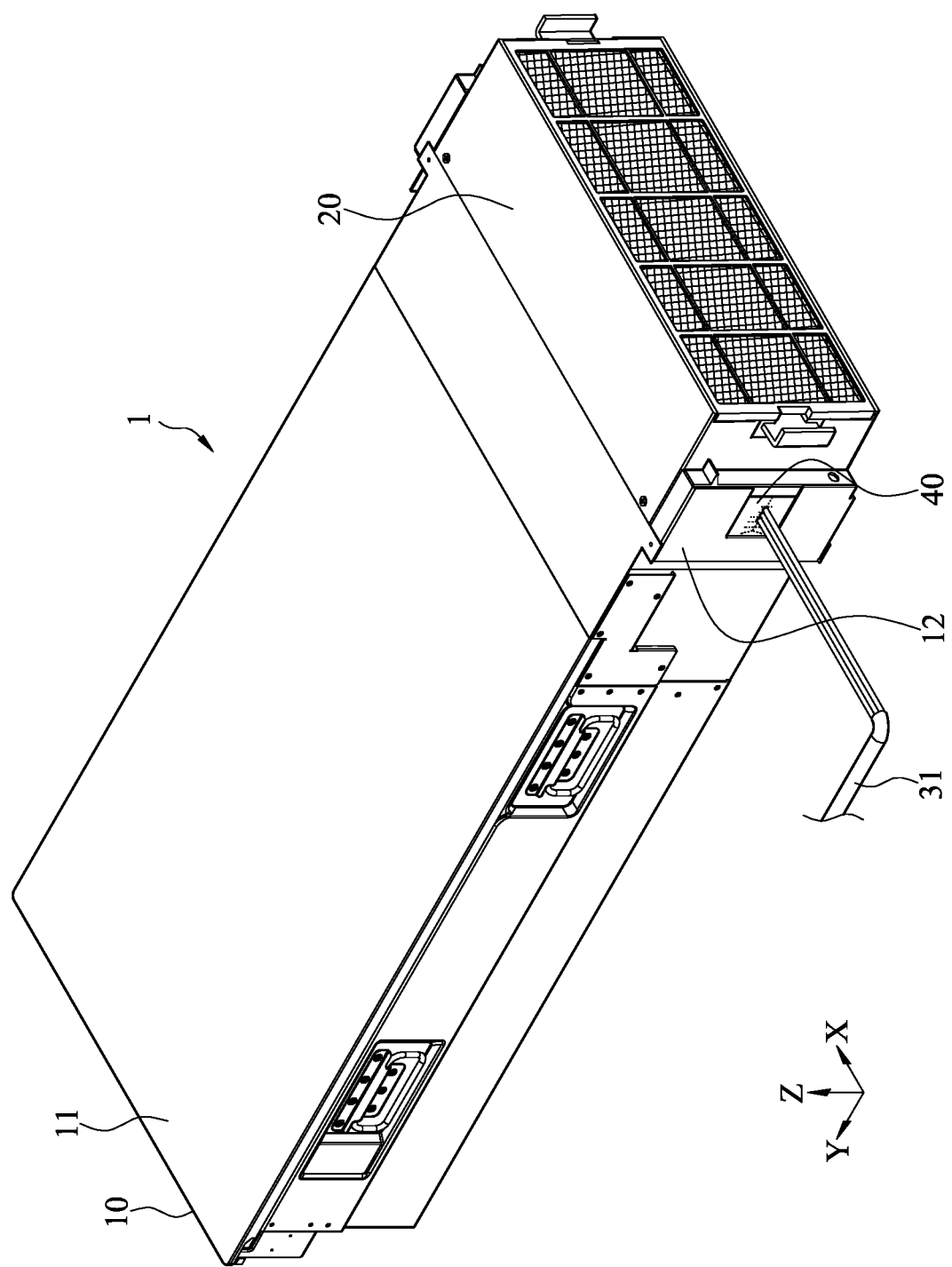
FIG. 1 illustrates a perspective view of a server according to some embodiments of the instant disclosure.
Figure 2:
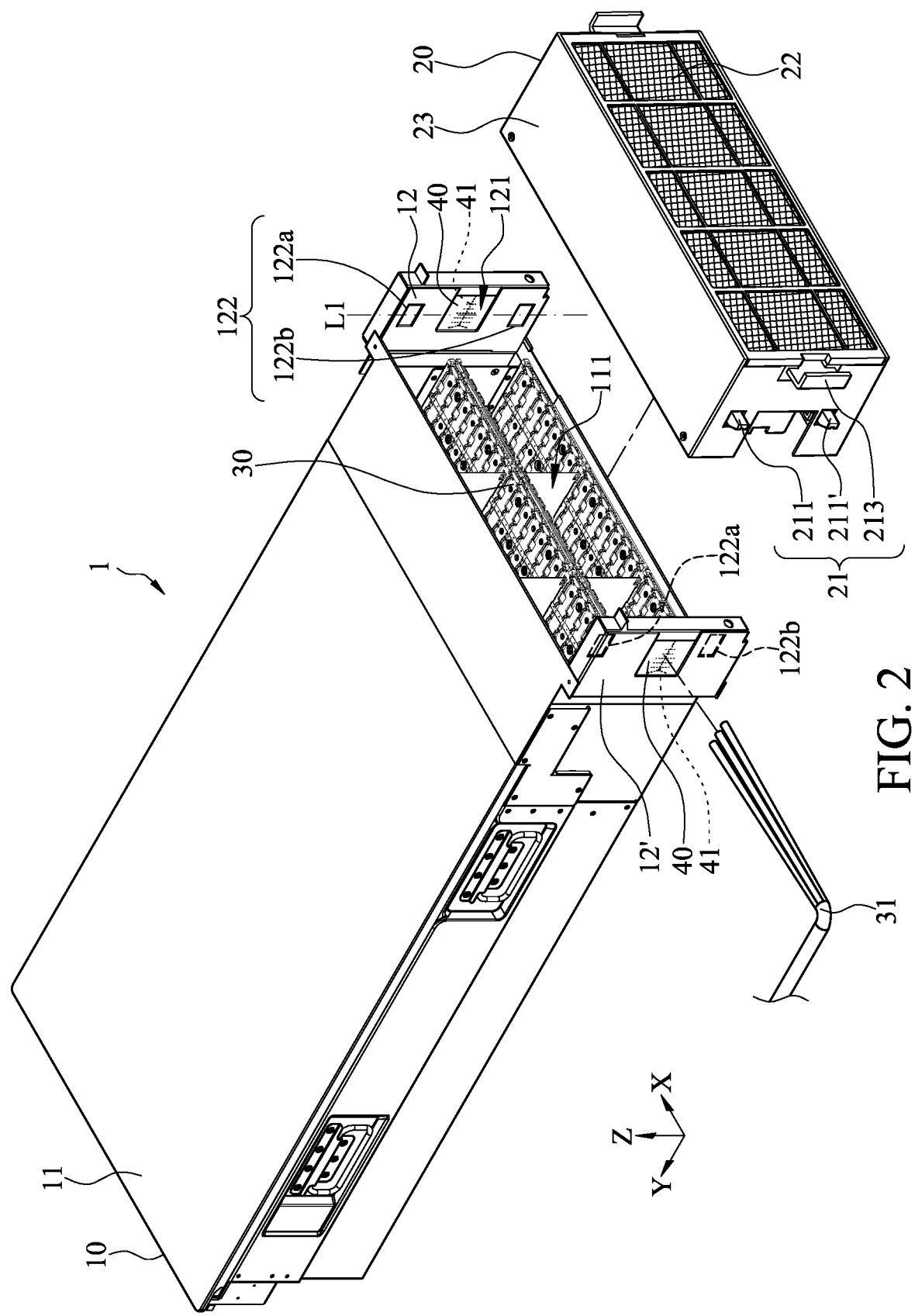
FIG. 2 illustrates an exploded view of a host chassis and a dustproof device according to some embodiments of the instant disclosure.

Please refer to FIG. 1 and FIG. 2. FIG. 1 illustrates a perspective view of a server according to some embodiments of the instant disclosure. FIG. 2 illustrates an exploded view of a host chassis and a dustproof device according to some embodiments of the instant disclosure. In some embodiments, as shown in FIG. 1, a server 1 comprises a host chassis 10, a circuit board 30, a transmission cable 31, and a filler 40. The host chassis 10 comprises a housing 11, a fixing assembly 12, and a dustproof device 20. The housing 11 has an assembling opening 111. The fixing assembly 12 is connected to the housing 11 and has an accommodating portion 121 and a first fixing portion 122. The dustproof device 20 has a second fixing portion 21 and a filtering portion 22, the second fixing portion 21 is detachably connected the first fixing portion 12, and the filtering portion 22 is in communication with the assembling opening 111. The filler 40 is located in the accommodating portion 121. The circuit board 30 is located in the housing 11 of the host chassis 10. The transmission cable 31 is located in the filler 40.

Figure 8:
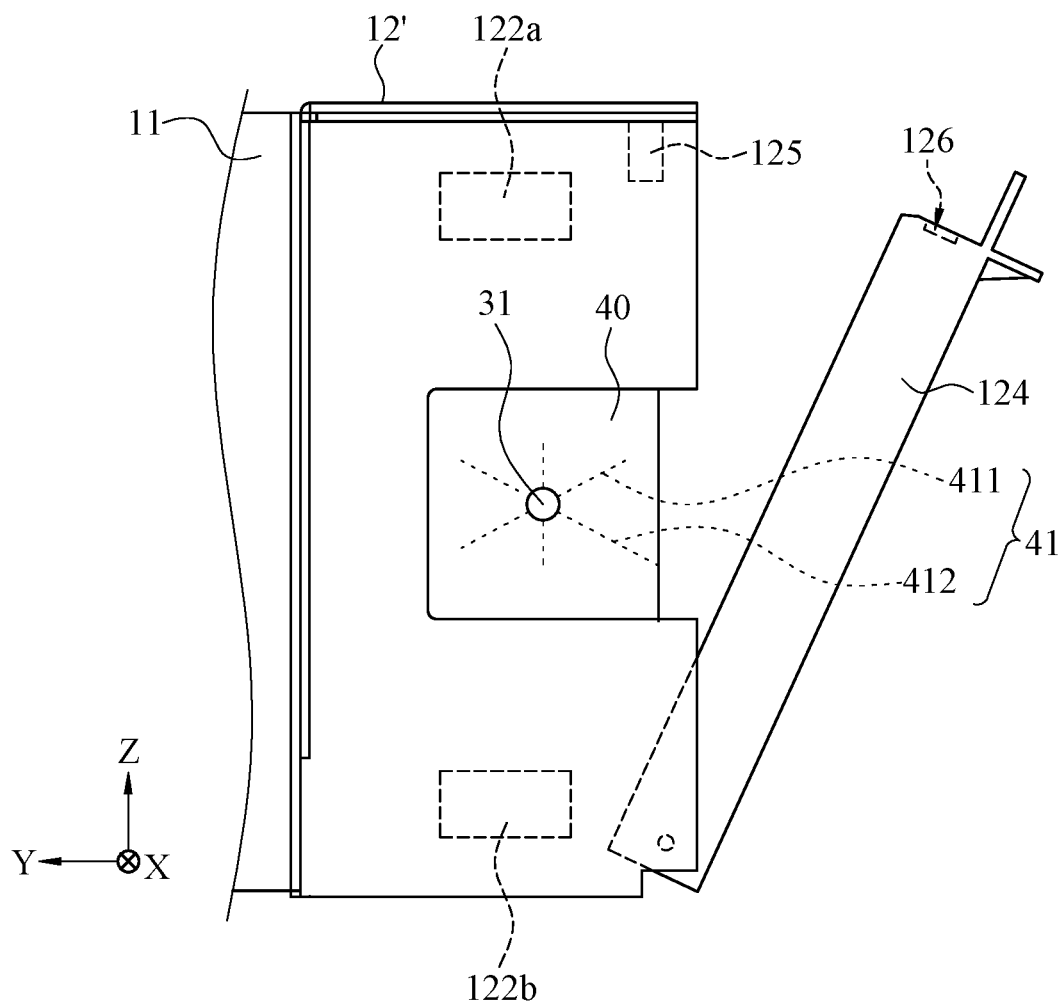
FIG. 8 illustrates a schematic view (1) of the slit of the filler according to some embodiments of the instant disclosure.
Figure 9:
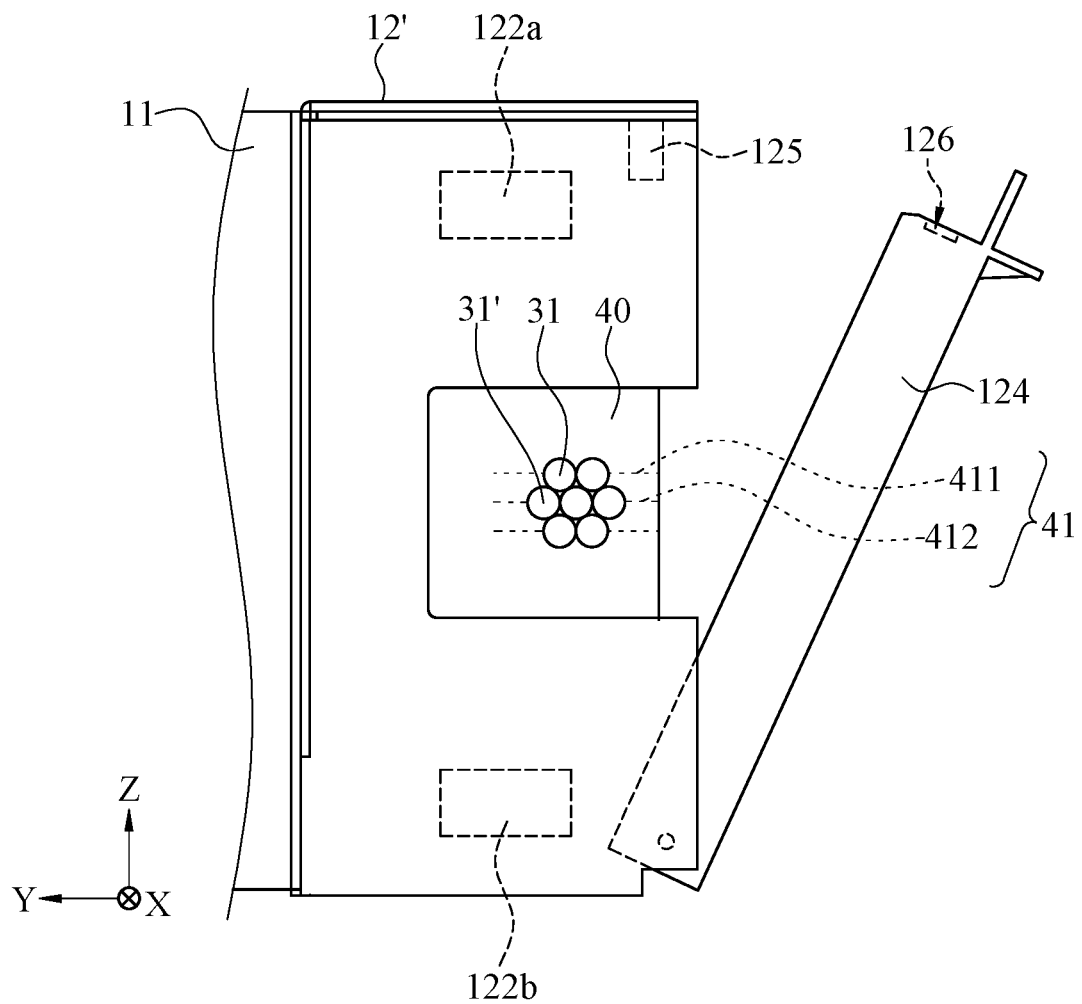
FIG. 9 illustrates a schematic view (2) of the slit of the filler according to some embodiments of the instant disclosure.

The server 1 may be a tower server, a rack server, a blade server, a cabinet server, or the like. The host chassis 10 is supported the circuit board 30, the transmission cable 31 is connected to the circuit board 30, and the transmission cable 31 extends outwardly through the filler 40, so that the circuit board 30 can transmit signals or connect to electricity through the transmission cable 31. In some embodiments, as shown in FIG. 2, two sides of the housing 11 of the host chassis 10 are respectively connected to two fixing assemblies 12, 12', so that the dustproof device 20 is fixed with the two fixing assemblies 12, 12', respectively. The housing 11 may be connected to a single fixing assembly 12 (or the fixing assembly 12'). The fixing assembly 12 and the fixing assembly 12' may have the same substantial structure, and the description of the fixing assembly 12 is also suitable for the fixing assembly 12'. The dustproof device 20 is detachably connected to the first fixing portion 122 of the fixing assembly 12 through the second fixing portion 21, so that the dustproof device 20 can be fixed with the housing 11. In some embodiments, the filler 40 is made of an elastic material (such as a sponge, a foam, or a rubber), and the filler 40 is located in the accommodating portion 121. Therefore, when the transmission cable 31 is located in the filler 40, pollution matters can be prevented from entering the housing 11. It is understood that, in some embodiments, the description of "the transmission cable 31 is located in the filler 40" may be referred to that after two stacked fillers 40 are located in the accommodating portion 121, the transmission cable 31 passes through the two fillers 40 through a gap between the two fillers 40. Alternatively, in some embodiments, such description may be referred to that the filler 40 has a slit 41 (as shown in FIG. 8 and FIG. 9), and the transmission cable 31 passes through the filler 40 through the slit 41 (illustrations of the embodiments are provided later). In some embodiments, the transmission cable 31 may be a power cable and/or a network cable. In some embodiments, the first fixing portion 122 may be a through hole or a groove (which will be illustrated later).

The dustproof device 20 is filtered the dusts entering the host chassis 10. Specifically, in this embodiment, the dustproof device 20 is fixed with the housing 11, so that the assembling opening 111 is in communication with the filtering portion 22. When the host chassis 10 is in operation, ambient air can be guided into the interior of the housing 11 through the dustproof device 20 for performing heat dissipation on the circuit board 30 supported in the housing 11. When the air passes through the dustproof device 20, pollution matters (such as, dusts or particulate matters) in the air can be filtered by the filtering portion 22, so that the pollution matters in the air can be prevented from entering the interior of the housing 11. In some embodiments, the filtering portion 22 comprises a filtering material, and the filtering material may be at least one selected from the group consisting of an active carbon filter screen, a nonwoven fabric filter screen, a high-efficiency particulate air (HEPA) filter screen, and an electrostatic filter screen.

Figure 3:
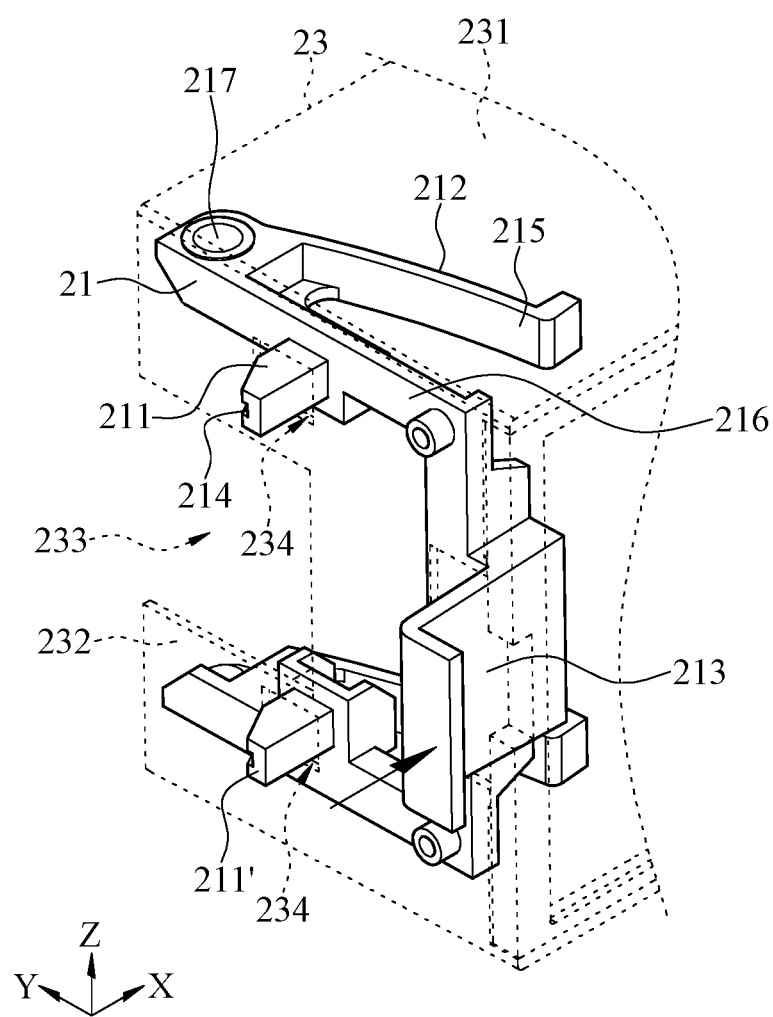
FIG. 3 illustrates a partial cross-sectional view of the dustproof device according to some embodiments of the instant disclosure, wherein the positioning latch of the second fixing portion is at the first position.
Figure 4:
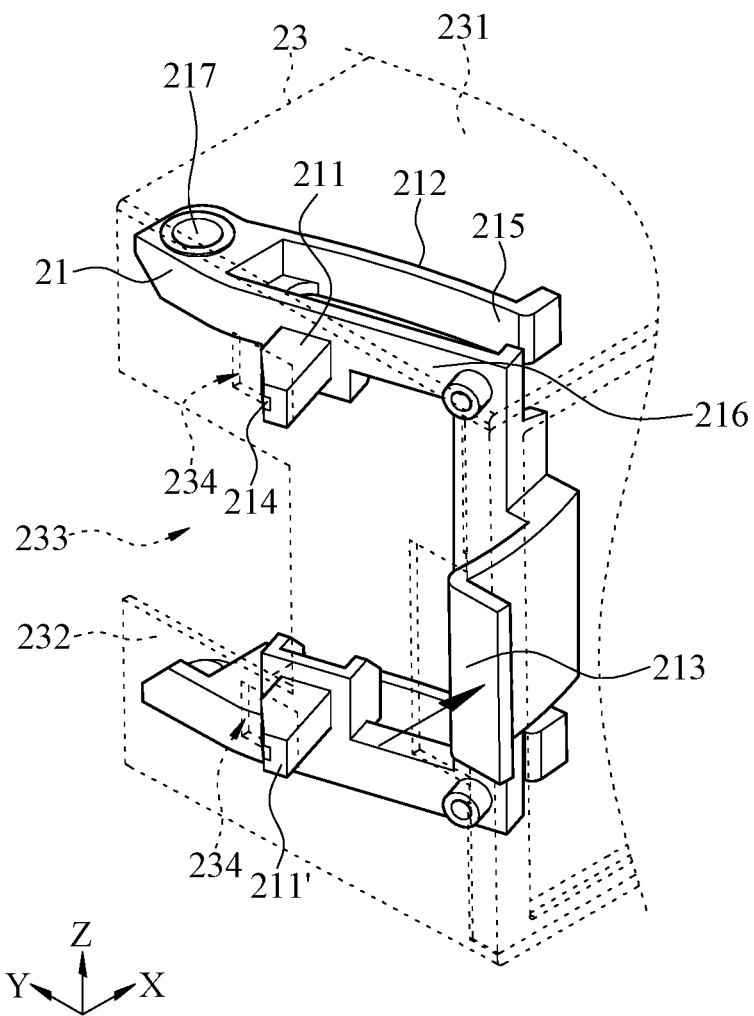
FIG. 4 illustrates a schematic view showing the operation of the second fixing portion shown in FIG. 3, wherein the positioning latch is at the second position.
Figure 5:
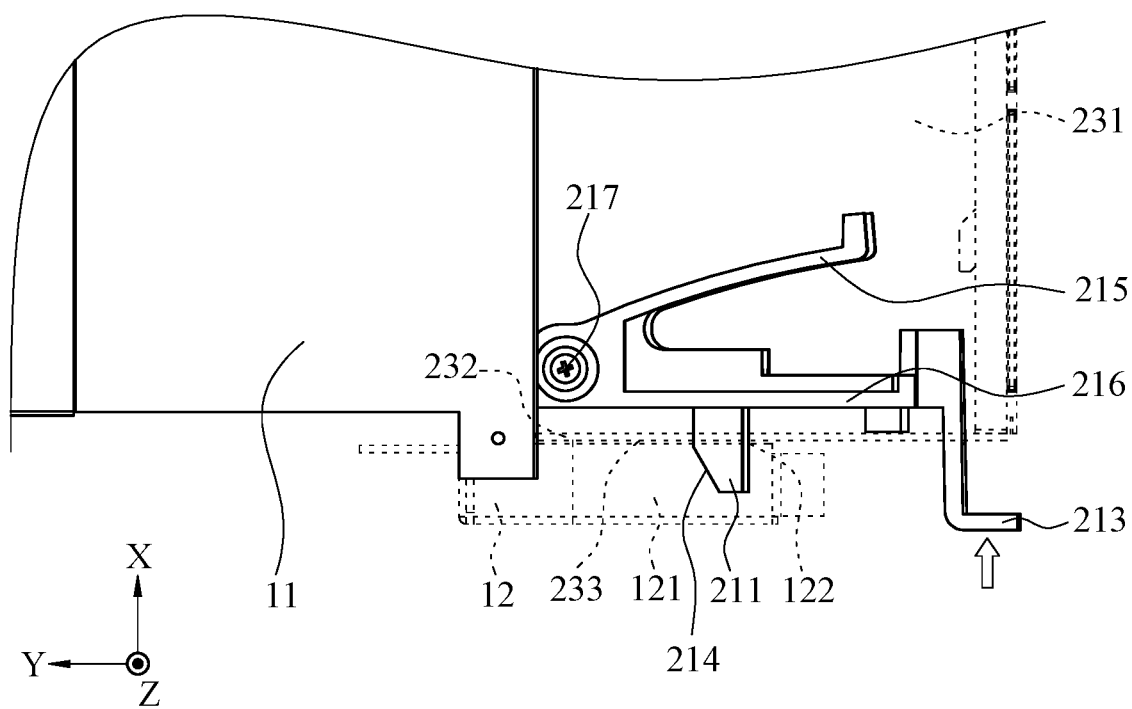
FIG. 5 illustrates a schematic view showing that the positioning latch is fixed with the first fixing portion when the positioning latch is at the first position according to some embodiments of the instant disclosure.

Please refer to FIG. 3, FIG. 4, and FIG. 5. FIG. 3 illustrates a partial cross-sectional view of the dustproof device according to some embodiments of the instant disclosure, wherein the positioning latch of the second fixing portion is at the first position. In FIG. 3, the shell of the dustproof device is illustrated with dashed lines, and the position of the second fixing portion with respect to the dustproof device is shown in FIG. 3. FIG. 4 illustrates a schematic view showing the operation of the second fixing portion shown in FIG. 3, wherein the positioning latch is at the second position. FIG. 5 illustrates a schematic view showing that the positioning latch is fixed with the first fixing portion when the positioning latch is at the first position according to some embodiments of the instant disclosure. As shown in FIG. 1 to FIG. 5, in some embodiments, the second fixing portion 21 comprises a positioning latch 211, an elastic arm 212, and an operating portion 213. The elastic arm 212 is connected to the positioning latch 212 and the operating portion 213. The positioning latch 211 has a first position (the position of the positioning latch 211 shown in FIG. 3) and a second position (the position of the positioning latch 211 shown in FIG. 4). The positioning latch 211 is normally at the first position. When the operating portion 213 is actuated (for example, when the operating portion 213 is pushed toward the +X axis direction shown in FIG. 3), the elastic arm 212 allows the positioning latch 211 to be selectively at the first position or the second position. When the positioning latch 211 is at the first position, the positioning latch 211 is fixed with the first fixing portion 122 (as the first fixing portion 122 shown in FIG. 5). It is understood that, the description of "the elastic arm 212 allows the positioning latch 211 to be selectively at the first position or the second position" may be referred to that when the operating portion 213 is not actuated yet, the elastic arm 212 is not driven by the operating portion 213, so that the positioning latch 211 is retained at the first position; when the operating portion 213 is actuated, the elastic arm 212 is driven by the operating portion 213, so that the positioning latch 211 is moved from the first position to the second position. In some embodiments, the dustproof device 20 further comprises a shell 23. The shell 23 has a top plate 231 and a side plate 232, the side plate 232 has an avoidance opening 233 and a through hole 234, and the second fixing portion 21 is connected to the side plate 232 and the top plate 231. When the positioning latch 211 is at the first position, the positioning latch 211 protrudes out of the through hole 234, and the transmission cable 31 is located in the avoidance opening 233 and the assembling opening 111 and protrudes out of the filler 40. When the positioning latch 211 is fixed with the first fixing portion 122, the avoidance opening 233 corresponds to the accommodating portion 121 of the fixing assembly 12 (as the position of the avoidance opening 233 and the position of the accommodating portion 121 shown in FIG. 5), so that the transmission cable 31 is located in the avoidance opening 233 and the assembling opening 111, and the transmission cable 31 passes through the filler 40 and protrudes out of the housing 11. In some embodiments, the elastic arm 212 comprises a fixed sidearm 215, a movable sidearm 216, and a locked point 217. The locked point 217 is pivotally connected to the top plate 231. When the operating portion 213 is actuated, the movable sidearm 216 drives the positioning latch 211 to be selectively at the second position. The fixed sidearm 215 can be fixed with the shell 23. When the operating portion 213 is actuated, the operating portion 213 drives the movable sidearm 216, wherein one of two ends of the movable sidearm 216 is fixed with the locked point 217 as a fulcrum, and the other end of the movable sidearm 216 is moved toward the fixed sidearm 215. The movable sidearm 216 further drives the positioning latch 211 to the second position, so that the positioning latch 211 is detached from the first fixing portion 122, and the fixation between the dustproof device 20 and the host chassis can be released. In some embodiments, one end of the positioning latch 211 has a guiding surface 214 for guiding the positioning latch 211 into the first fixing portion 122. The guiding surface 214 may be a curved surface or an inclined surface. When the positioning latch 211 corresponds to the first fixing portion 122 and is moved from the second position to the first position, the positioning latch 211 contacts the first fixing portion 122 through the guiding surface 214, so that the guiding surface 214 provides a guiding function, and the positioning latch 214 can be guided into the first fixing portion 122 quickly and accurately.

Furthermore, as shown in FIG. 2 and FIG. 3, in some embodiments, the first fixing portion 122 has a first groove 122a and a second groove 122b. The accommodating portion 121 is between the first groove 122a and the second groove 122b, and the first groove 122a and the second groove 122b are substantially aligned with a plumb line (as the plumb line L1 shown in FIG. 2). In this embodiment, the second fixing portion 21 may have a plurality of positioning latches 211, 211', and the positioning latches 211, 211' respectively correspond to the first groove 122a and the second groove 122b. When the positioning latches 211, 211' are selectively moved from the second position to the first position, the positioning latches 211, 211' may be inserted into the first groove 122a and the second groove 122b, respectively. Through the mating between the two positioning latches 211, 211' and the first groove 122a and the second groove 122b, the first groove 122a and the second groove 122b provide the two positioning latches 211, 211' with a limiting function in a vertical direction (as the Z-axis direction shown in FIG. 2) and a horizontal direction (as the Y-axis direction shown in FIG. 2), so that the stability of the fixation between the dustproof device 20 and the host chassis 10 can be enhanced.

Figure 6:
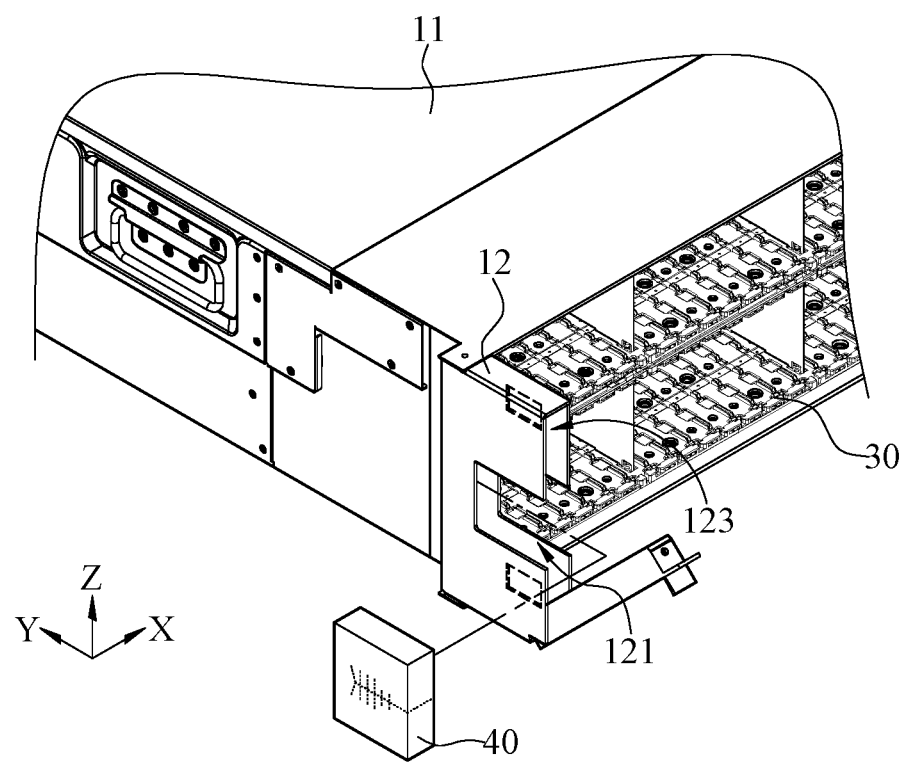
FIG. 6 illustrates a schematic view showing the relative positions of the accommodating portion and the opening portion of the fixing assembly according to some embodiments of the instant disclosure.
Figure 7:
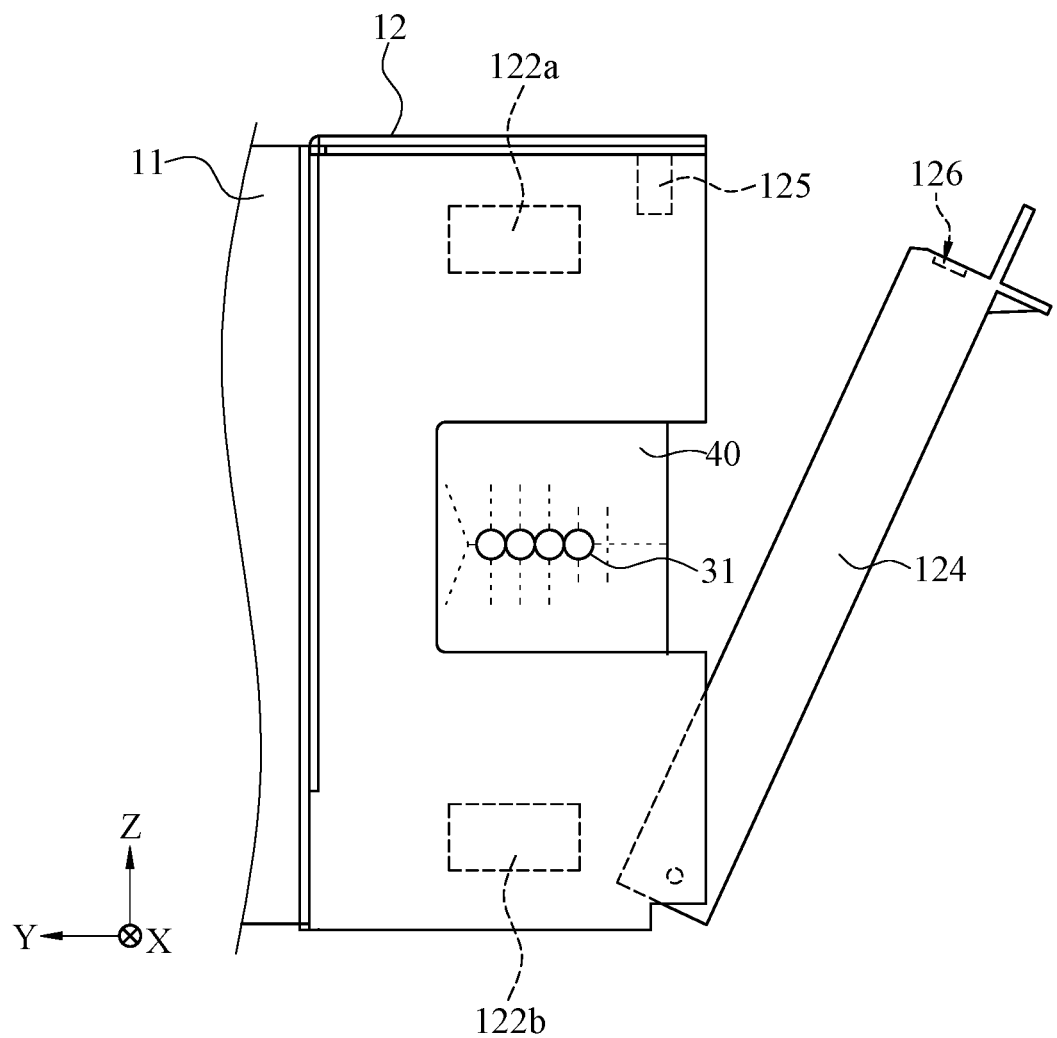
FIG. 7 illustrates a schematic view showing that the cover plate of the fixing assembly is fixed with the opening portion according to some embodiments of the instant disclosure.

Please refer to FIG. 6 and FIG. 7. FIG. 6 illustrates a schematic view showing the relative positions of the accommodating portion and the opening portion of the fixing assembly according to some embodiments of the instant disclosure, wherein in FIG. 6, the transmission cable 31 is not illustrated. FIG. 7 illustrates a schematic view showing the cover plate of the fixing assembly is fixed at the opening portion according to some embodiments of the instant disclosure. As shown in FIG. 6 and FIG. 7, in some embodiments, the fixing assembly 12 comprises an opening portion 123 and a cover plate 124, the opening portion 123 is in communication with the accommodating portion 121, and the cover plate 124 is pivotally connected to the opening portion 123. When the cover plate 124 is actuated, the cover plate 124 is selectively at the opening portion 123. The cover plate 124 is pivotally connected 123, so that the cover plate 124 can be rotated with respect to the opening portion 123. Moreover, when the cover plate 124 is at the opening portion 123, the cover plate 124 can be accommodated in the opening portion 123, so that the cover plate 124 can enclose the accommodating portion 121 to ensure that the filler 40 and the transmission cable 31 are retained in the accommodating portion 121. In some embodiments, the opening portion 123 has a positioning post 125, and the cover plate 124 has a positioning hole 126. When the cover plate 124 is selectively at the opening portion 123, the positioning post 125 is located in the positioning hole 126. The positioning hole 126 of the cover plate 124 can be fixed behind the positioning post 125, so that the cover plate 124 can be retained at the opening portion 123.

Please refer to FIG. 8 and FIG. 9. FIG. 8 illustrates a schematic view (1) of the slit of the filler according to some embodiments of the instant disclosure. FIG. 9 illustrates a schematic view (2) of the slit of the filler according to some embodiments of the instant disclosure. In some embodiments, as shown in FIG. 8 and FIG. 9, the filler 40 has a slit 41, and the slit 41 can extend to the side portion of the filler 40, so that the transmission cable 31 can enter the slit 41 through the side portion of the filler 40. In some embodiments, as shown in FIG. 8, the slit 41 of the filler 40 has a first slit 411 and a second slit 412. The first slit 411 is intersected with the second slit 412, and the first slit 411 and the second slit 412 may be arranged radially. The transmission cable 31 may protrude out of the filler 40 through the intersection between the first slit 411 and the second slit 412. When the transmission cable 31 protrudes out of the slit 41, the hole between the first slit 411 and the second slit 412 can be expanded according to the diameter of the transmission cable 31 (or the diameter of a bundle of several transmission cables 31), so that the inner wall of the hole between the first slit 411 and the second slit 412 can be closely attached to the surface of the transmission cable 31. Therefore, through the filler 40, the fixing assembly 12 can block the pollution matters from entering the housing 11 through the gaps among the first slit 411, the second slit 412, and the transmission cable 31. As shown in FIG. 9, in some embodiments, the first slit 411 may be parallel to the second slit 412, and a plurality of transmission cables 31 may protrude out of the first slit 411 and/or the second slit 412. The transmission cables 31 at the first slit 411 and the transmission cables 31' at the second slit 412 may be arranged alternately to form a honeycomb structure. According to this embodiment, for a plurality of transmission cable 31, 31' separated from each other, the transmission cables 31, 31' are arranged to form a honeycomb structure, so that the gap between the transmission cables 31, 31' can be reduced. Moreover, the first slit 411 and the second slit 412 can be closely attached to the transmission cables 31, 31', so that the pollution matters can be prevented from entering the housing 11 through the gaps among the first slit 411, the second slit 412, and each of the transmission cables 31, 31'.

Based on the above, according to one or some embodiments of the instant disclosure, a server 1 is provided and comprises a host chassis 10 and a dustproof device 20. The dustproof device 20 is detachably connected to the first fixing portion 122 of the fixing assembly 12 through the second fixing portion 21, so that the dustproof device 20 can be fixed with the housing of the host chassis 10. Moreover, the filler 40 is located in the accommodating portion 121 of the fixing assembly 12. Hence, when the transmission cable 31 passes through the filler 40, the size of the gap between the filler 40 and the transmission cable 31 can be reduced as much as possible, so that the filler 40 can block the pollution matters from entering the housing 11.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A server comprising:
   a housing having an assembling opening;
   a fixing assembly connected to the housing, wherein the fixing assembly has an accommodating portion and a first fixing portion;
   a dustproof device having a second fixing portion and a filtering portion, wherein the second fixing portion is detachably connected to the first fixing portion, and the filtering portion is in communication with the assembling opening;
   a filler located in the accommodating portion;
   a circuit board located in the housing; and
   a transmission cable located in the filler;
   wherein the second fixing portion comprises a positioning latch, an elastic arm, and an operating portion, the elastic arm is connected to the positioning latch and the operating portion; when the operation portion is actuated, the elastic arm allows the positioning latch to be selectively fixed with the first fixing portion.

2. The server according to claim 1, wherein the positioning latch has a first position and a second position, and the positioning latch is normally at the first position; when the operation portion is actuated, the elastic arm allows the positioning latch to be selectively at the first position or the second position; when the positioning latch is at the first position, the positioning latch is fixed with the first fixing portion.

3. The server according to claim 2, wherein the dustproof device further comprises a shell, the shell has a top plate and a side plate, the side plate has an avoidance opening and a through hole, and the second fixing portion is connected to the top plate and the side plate; when the positioning latch is at the first position, the positioning latch protrudes out of the through hole, and the transmission cable is located in the avoidance opening and the assembling opening and protrudes out of the filler.

4. The server according to claim 3, wherein the elastic arm comprises a fixed sidearm, a movable sidearm, and a locked point, and the locked point is pivotally connected to the top plate; when the operation portion is actuated, the movable sidearm drives the positioning latch to be selectively at the second position.

5. The server according to claim 4, wherein one end of the positioning latch has a guiding surface for guiding the positioning latch into the first fixing portion.

6. The server according to claim 5, wherein the first fixing portion has a first groove and a second groove, the accommodating portion is between the first groove and the second groove, and the first groove and the second groove are substantially aligned with a plumb line.

7. The server according to claim 6, wherein the fixing assembly comprises an opening portion and a cover plate, the opening portion is in communication with the accommodating portion, and the cover plate is pivotally connected to the opening portion; when the cover plate is actuated, the cover plate is selectively at the opening portion.

8. The server according to claim 7, wherein the opening portion has a positioning post, and the cover plate has a positioning hole; when the cover plate is at the opening portion, the positioning post is located in the positioning hole.

9. The server according to claim 8, wherein the filler has a slit, the slit has a first slit and a second slit, and the first slit is intersected with the second slit.

10. The server according to claim 8, wherein the filler has a slit, the slit has a first slit and a second slit, and the first slit is parallel to the second slit.

11. A host chassis comprising:
    a housing having an assembling opening;
    a fixing assembly connected to the housing, wherein the fixing assembly has an accommodating portion and a first fixing portion;
    a filler located in the accommodating portion; and
    a dustproof device having a second fixing portion and a filtering portion, wherein the second fixing portion is detachably connected to the first fixing portion, and the filtering portion is in communication with the assembling opening;
    wherein the second fixing portion comprises a positioning latch, an elastic arm, and an operating portion, the elastic arm is connected to the positioning latch and the operating portion; when the operation portion is actuated, the elastic arm allows the positioning latch to be selectively fixed with the first fixing portion.

12. The host chassis according to claim 11, wherein the positioning latch has a first position and a second position, and the positioning latch is normally at the first position; when the operation portion is actuated, the elastic arm allows the positioning latch to be selectively at the first position or the second position; when the positioning latch is at the first position, the positioning latch is fixed with the first fixing portion.

13. The host chassis according to claim 12, wherein the dustproof device further comprises a shell, the shell has a top plate and a side plate, the side plate has an avoidance opening and a through hole, and the second fixing portion is connected to the top plate and the side plate; when the positioning latch is at the first position, the positioning latch protrudes out of the through hole.

14. The host chassis according to claim 13, wherein the elastic arm comprises a fixed sidearm, a movable sidearm, and a locked point, and the locked point is pivotally connected to the top plate; when the operation portion is actuated, the movable sidearm drives the positioning latch to be selectively at the second position.

15. The host chassis according to claim 14, wherein one end of the positioning latch has a guiding surface for guiding the positioning latch into the first fixing portion.

16. The host chassis according to claim 15, wherein the first fixing portion has a first groove and a second groove, the accommodating portion is between the first groove and the second groove, and the first groove and the second groove are substantially aligned with a plumb line.

17. The host chassis according to claim 16, wherein the fixing assembly comprises an opening portion and a cover plate, the opening portion is in communication with the accommodating portion, and the cover plate is pivotally connected to the opening portion; when the cover plate is actuated, the cover plate is selectively at the opening portion.

18. The host chassis according to claim 17, wherein the opening portion has a positioning post, and the cover plate has a positioning hole; when the cover plate is at the opening portion, the positioning post is located in the positioning hole.

19. The host chassis according to claim 18, further comprising a filler, wherein the filler is located in the accommodating portion and has a slit.

20. The host chassis according to claim 19, wherein the slit has a first slit and a second slit, and the first slit is intersected with or parallel to the second slit.

* * * * *